(12) United States Patent
Batel et al.

(10) Patent No.: US 9,813,032 B2
(45) Date of Patent: Nov. 7, 2017

(54) NEGATIVE IMPEDANCE CIRCUIT

(71) Applicant: Commissariat à l'Energie Atomique et aux Energies Alternatives, Paris (FR)

(72) Inventors: Lotfi Batel, Grenoble (FR); Jean-François Pintos, Saint Blaise du Buis (FR); Lionel Rudant, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/357,863

(22) Filed: Nov. 21, 2016

(65) Prior Publication Data
US 2017/0163224 A1    Jun. 8, 2017

(30) Foreign Application Priority Data
Dec. 2, 2015    (FR) ...................................... 15 61698

(51) Int. Cl.
| H03H 11/48 | (2006.01) |
| H03F 1/56 | (2006.01) |
| H03F 3/19 | (2006.01) |
| H03H 11/10 | (2006.01) |
| H04B 3/18 | (2006.01) |

(52) U.S. Cl.
CPC .............. *H03F 1/565* (2013.01); *H03F 3/19* (2013.01); *H03H 11/10* (2013.01); *H03H 11/48* (2013.01); *H04B 3/18* (2013.01); *H03F 2200/165* (2013.01); *H03F 2200/294* (2013.01); *H03F 2200/451* (2013.01)

(58) Field of Classification Search
CPC .......................................... H03H 11/48–11/52
USPC .................................................. 333/213–217
See application file for complete search history.

(56) References Cited

U.S. PATENT DOCUMENTS

| 3,042,759 | A |  | 7/1962 | Bonner |
| 3,204,048 | A |  | 8/1965 | De Monte |
| 4,056,688 | A |  | 11/1977 | Stiefel |
| 4,112,262 | A |  | 9/1978 | Stiefel |
| 4,904,952 | A | * | 2/1990 | Tanimoto ............ H03F 3/45103 330/252 |

(Continued)

OTHER PUBLICATIONS

Preliminary Search Report in French Patent Application No. 1561698; dated Jul. 21, 2016, 2 pages.

*Primary Examiner* — Dean Takaoka
*Assistant Examiner* — Alan Wong
(74) *Attorney, Agent, or Firm* — Moreno IP Law LLC

(57) ABSTRACT

A negative impedance circuit including: a first and a second bipolar transistors having a common collector, a base of the first transistor being connected to an emitter of the second transistor; a third and a fourth bipolar transistors having a common collector, a base of the third transistor being connected with an emitter of the fourth transistor; and at least one first impedance formed of one or of a plurality of passive components coupling the common collector of the first and second transistors to the common collector of the third and fourth transistors, a base of the second transistor being coupled to the collector of the third and fourth transistors and a base of the fourth transistor being coupled to the collector of the first and second transistors.

8 Claims, 3 Drawing Sheets

(56) References Cited

U.S. PATENT DOCUMENTS

| | | | | |
|---|---|---|---|---|
| 5,012,201 | A * | 4/1991 | Morita | H03H 11/46 330/252 |
| 6,621,331 | B2 * | 9/2003 | Pobanz | H03B 27/00 327/103 |
| 7,852,174 | B2 * | 12/2010 | Cathelin | H03B 5/326 333/188 |
| 8,339,198 | B2 * | 12/2012 | Mole | H03F 3/4508 330/252 |
| 8,723,625 | B2 * | 5/2014 | Lee | H03F 1/32 333/213 |
| 8,988,173 | B2 * | 3/2015 | Hitko | H03F 1/56 330/252 |

\* cited by examiner

NEGATIVE IMPEDANCE CIRCUIT

CROSS-REFERENCE TO RELATED APPLICATION

This application claims the priority benefit of French patent application number 15/61698, the content of which is hereby incorporated by reference in its entirety to the maximum extent allowable by law.

BACKGROUND

The present disclosure generally relates to electronic systems and, more specifically, to the forming of a circuit or converter having a negative impedance. The present disclosure more specifically relates to negative impedance converters intended for radio frequency transceiver chains.

DISCUSSION OF THE RELATED ART

In most electronic systems, and more particularly in (transmit and/or receive) radio frequency chains, impedance matching circuits are used. Such circuits, at the input and/or at the output of elements of a radio frequency chain are indispensable to ensure a correct transmission (without too much loss). According to the characteristics of the elements to be connected, it may be needed to generate a negative impedance in order to respect a reference impedance value (for example, 50 ohms, 75 ohms, 100 ohms, etc.).

Most negative impedance generation circuits should be dedicated to an operating frequency band and this frequency band is relatively narrow. Now, more and more, radio frequency transmission systems should have a wide band.

There is a need to improve circuits having a negative impedance, particularly for impedance matching purposes.

There also is a need for a wide-band negative impedance.

SUMMARY

An embodiment overcomes all or part of the disadvantages of negative impedance circuits.

An embodiment provides a wide-band solution.

An embodiment provides a solution particularly adapted to radio frequency transmission chains.

Thus, an embodiment provides a negative impedance circuit, comprising: a first and a second bipolar transistors having a common collector, a base of the first transistor being connected to an emitter of the second transistor; a third and a fourth bipolar transistors having a common collector, a base of the third transistor being connected to an emitter of the fourth transistor; and at least one first impedance formed of one or of a plurality of passive components coupling the common collector of the first and second transistors to the common collector of the third and fourth transistors, a base of the second transistor being coupled to the collector of the third and fourth transistors and a base of the fourth transistor being coupled to the collector of the first and second transistors.

According to an embodiment, said first impedance is at least inductive or capacitive.

According to an embodiment, a second impedance formed of one or of a plurality of passive components, connects the bases of the first and third transistors.

According to an embodiment, said second impedance is at least inductive or capacitive.

According to an embodiment, the emitters of the first and third transistors are respectively connected to terminals of the circuit.

According to an embodiment, the connection between the respective emitters of the first and third transistors and said terminals is performed via capacitive decoupling elements.

According to an embodiment, capacitive elements respectively connect the base of the second transistor to the common collector of the third and fourth transistors and the base of the fourth transistor to the common collector of the first and second transistors.

According to an embodiment, resistive biasing elements individually connect the common collectors of the first and second transistors and the bases of the third and fourth transistors to a terminal of application of a bias voltage.

According to an embodiment, the transistors are of PNP type.

According to an embodiment, the transistors are of NPN type.

The foregoing and other features and advantages will be discussed in detail in the following non-limiting description of dedicated embodiments in connection with the accompanying drawings.

BRIEF DESCRIPTION OF THE DRAWINGS

The features described in this disclosure are set forth with particularity in the appended claims. These features and attendant advantages will become apparent from consideration of the following detailed description, taken in conjunction with the accompanying drawings. One or more embodiments are now described, by way of example only, with reference to the accompanying drawings wherein like reference numerals represent like elements and in which:

DETAILED DESCRIPTION OF THE PRESENT EMBODIMENTS

Figure 1:
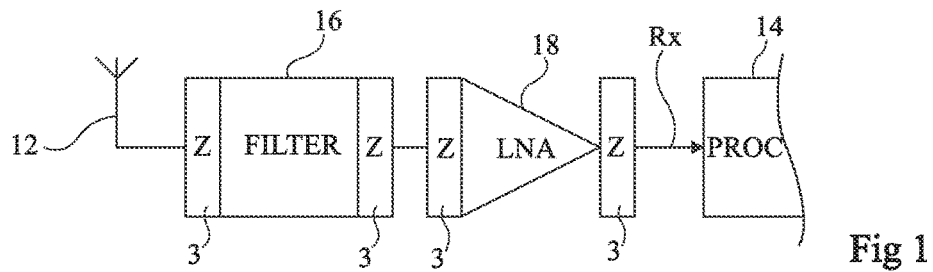
FIG. 1 is a simplified block diagram of an example of a radio frequency transmission chain of the type to which the described embodiments apply.

For clarity, only those elements which are useful to the understanding of the described embodiments have been shown and will be detailed. In particular, the use of a negative impedance has not been detailed, the described embodiments being compatible with current uses of such circuits. It should be noted that, in the drawings, the structural and/or functional elements common to the different embodiments may be designated with the same reference numerals and may have identical structural, dimensional, and material properties. Unless otherwise specified, expressions "approximately", "substantially", and "in the order of" mean to within 10%, preferably to within 5%. In the following description, the notion of coupling between two elements is used to designate a direct or indirect link (via passive elements) between two components while the notion of connection is used to specify a direct link, with no intermediate component.

FIG. 1 is a simplified block diagram of an example of a radio frequency transmission chain of the type to which the described embodiments apply.

Such a transmission chain comprises a plurality of elements series-connected between an antenna 12 and a circuit 14 (PROC) for processing the information received or to be transmitted. For example, antenna 12 is connected to a filter 16, mainly in charge of eliminating signals outside of the transmission band, itself connected to a low-noise amplifier 18 (LNA) of the received signals which are transmitted (Rx) to processing circuit 14. The above example considers the case of a receive mode. In transmit mode, the system may or not use the same antenna and generally comprises an amplifier between processing circuit 14 and antenna 12 (possibly with an interposed transmit filter).

To respect an impedance matching between the different components of the radio frequency chain, impedance (Z) matching circuits 3 are generally provided at the input and at the output of each component of the chain. In certain cases, one may need, according to the structure of the circuits, negative impedances to perform the matching.

The example of FIG. 1 is an arbitrarily-selected example and the embodiments which are described hereafter more generally apply to any radio transmission chain and more generally still to any application where a negative impedance is desired to be used, for example, contactless communication applications, integrated radio transmissions, radio transmitter front ends, etc.

Figure 2:
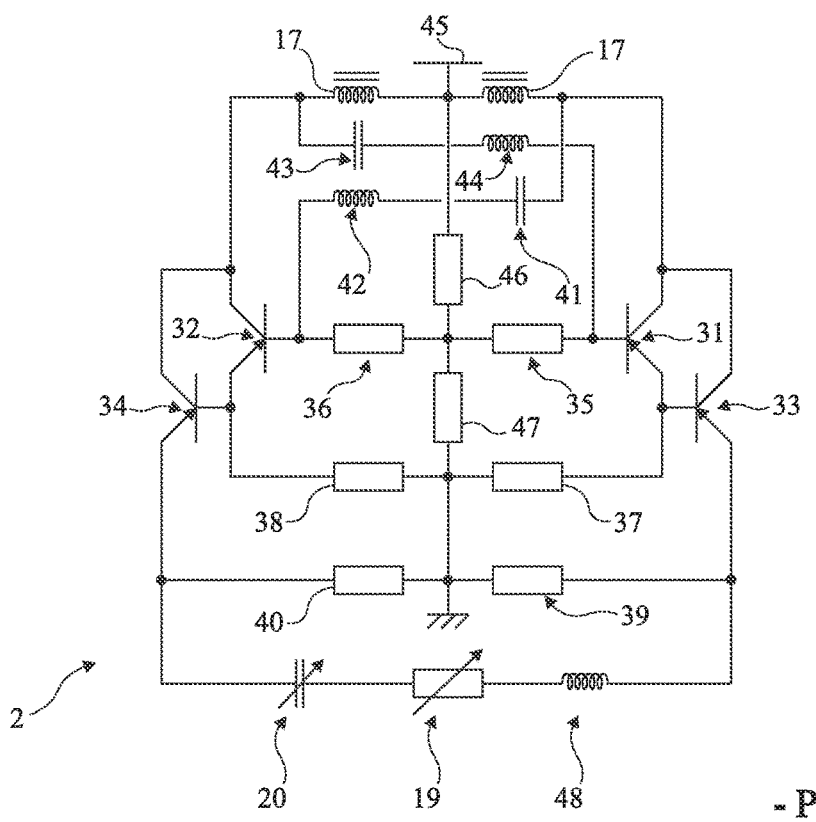
FIG. 2 is an electric diagram of a known example of negative impedance.

FIG. 2 is an electric diagram of an example of a circuit 2 generating a negative resistance. This example corresponds to the solution described in document U.S. Pat. No. 3,204,048.

Circuit 2 is based on the use of two pairs of PNP transistors, respectively 31, 33 and 32, 34. The emitters of transistors 33 and 34 are connected together via a series association of a RLC circuit formed of an inductance 48, of an adjustable resistor 19, and of an adjustable capacitor 20. The bases of transistors 33 and 34 are connected to the respective emitters of transistors 31 and 32. The collectors of transistors 31 and 33 are interconnected. The collectors of transistors 32 and 34 are interconnected. The base of transistor 31 is connected, by an inductance 44 in series with a capacitor 43, to the common collector of transistors 32 and 34. The base of transistor 32 is connected, by an inductance 42 in series with a capacitor 41, to the common collector of transistors 31 and 33. The bases of transistors 31 and 32 are connected together by a series association of resistors 35 and 36 having their junction point connected by resistors 46 and 47, respectively to a terminal 45 of application of a positive potential and to ground. The emitters of transistors 33 and 34 are each connected to ground by a resistor, respectively 39, 40. The bases of transistors 33 and 34 (emitters of transistors 31 and 32) are each connected to ground by a resistor, respectively 37, 38. The terminals of negative resistor 2 are the collectors of transistors 31 and 32 which are connected to inductances 17 of a transformer.

Figure 2A:
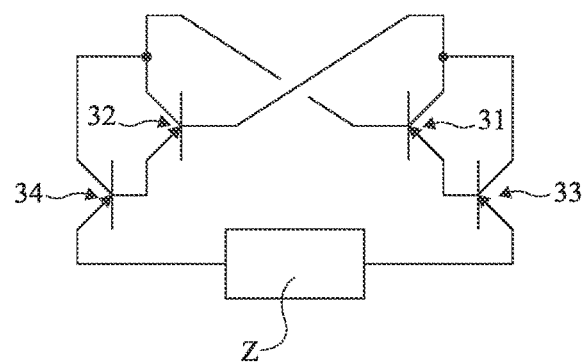
FIG. 2A shows an equivalent radio frequency diagram of the assembly of FIG. 2.

FIG. 2A shows an equivalent radio frequency diagram of the assembly of FIG. 2, that is, without the biasing and decoupling elements.

The diagram comes down to four transistors associated two by two in a Darlington assembly, an impedance Z connecting the emitter of transistor 33 to the emitter of transistor 34.

Such a solution for generating a negative resistance can however not be transposed to the forming of a complex negative impedance. Now, in the applications targeted by the present disclosure, it is often necessary to have complex matching impedances, and not only resistive impedances.

Figure 3:
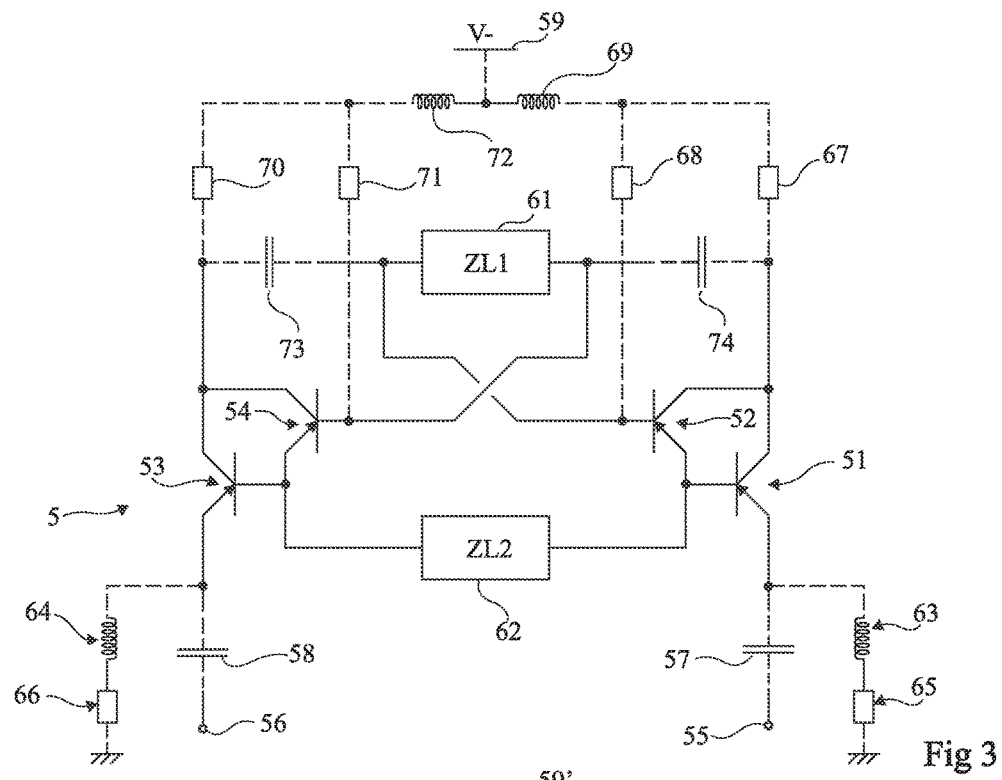
FIG. 3 is an electric diagram of an embodiment of a negative impedance circuit.

FIG. 3 is an electric diagram of an embodiment of a negative impedance circuit 5 based on PNP-type bipolar transistors.

Circuit 5 is based on the use of two pairs of PNP transistors, respectively 51, 52, and 53, 54. The emitters of transistors 51 and 53 are respectively coupled to terminals 55 and 56 of the negative impedance which has been formed. Terminals 55 and 56 are intended to be connected to the element having an input and/or output impedance which is desired to be matched. Preferably, a capacitive element, respectively 57 or 58, for decoupling a possible DC component of the signal, is interposed between the emitter of transistor 51 or 53 and respective terminal 55 or 56. The respective bases of transistors 51 and 53 are connected to the respective emitters of transistors 52 and 54. Further, the collectors of transistors 51 and 52 are interconnected and the collectors of transistors 53 and 54 are interconnected.

To form a negative impedance, the bases of transistors 52 and 54 are coupled by a first impedance 61 (ZL1) formed of passive components. Preferably, to provide an additional degree of liberty (of adjustment), the emitters of transistors 52 and 54 are coupled by a second impedance 62 (ZL2) formed of passive components. Advantage is taken from the fact that the paired structure of transistors 51, 52, and 53, 54 can incorporate an additional radio frequency path formed by impedance 62.

The biasing of circuit 5 is ensured by resistive, capacitive, and inductive elements. For example, the emitters of transistors 51 and 53 are respectively coupled to ground by series associations of inductive elements 63, respectively 64, and resistive elements 65, respectively 66. Still as an example, the common collectors of transistors 51 and 52 and the base of transistor 52 are connected, by resistive elements, respectively 67 and 68, to an inductive element 69 of connection to a terminal 59 of application of a potential V− negative with respect to ground. Further, the common collector of transistors 53 and 54 and the base of transistor 54 are connected, by resistive elements, respectively 70 and 71, to an inductive element 72 of connection to terminal 59. Further, the base of transistor 52 is coupled, by a capacitive element 73, to the common collector of transistors 53 and 54, and the base of transistor 54 is coupled, by a capacitive element 74, to the common collector of transistors 51 and 52. It may also be said that passive impedance 61 couples the collectors of the transistor pairs.

To show the function of biasing or of decoupling of elements 57 to 59 and 63 to 74, their respective connections have been illustrated in dotted lines.

Figure 4:
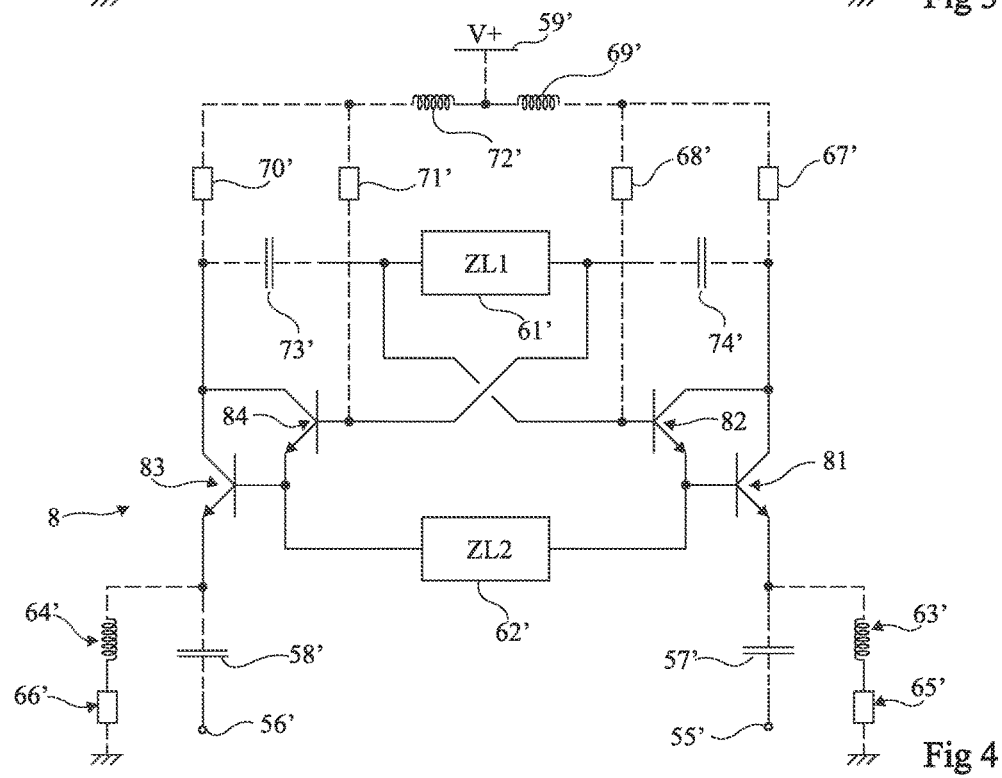
FIG. 4 is an electric diagram of another embodiment of a negative impedance circuit.

FIG. 4 is an electric diagram of another embodiment of a negative impedance circuit 8, based on NPN-type bipolar transistors.

Circuit 8 is based on the use of two pairs of NPN transistors, respectively 81, 82, and 83, 84. The emitters of transistors 81 and 83 are respectively coupled to terminals 55' and 56' of the negative impedance which has been formed. Terminals 55' and 56' are intended to be connected to the element having an input and/or output impedance which is desired to be matched. Preferably, a capacitive element, respectively 57' or 58', for decoupling a possible DC component of the signal, is interposed between the emitter of transistor 81 or 83 and the respective terminal 55' or 56'. The respective bases of transistors 81 and 83 are connected to the respective emitters of transistors 82 and 84. Further, the collectors of transistors 81 and 82 are interconnected and the collectors of transistors 83 and 84 are interconnected.

To form the negative impedance, the bases of transistors 82 and 84 are coupled by a first impedance 61' (ZL1) formed of passive components. As in the embodiment of FIG. 3, to provide an additional degree of liberty, the emitters of transistors 82 and 84 are, preferably, coupled by a second impedance 62' (ZL2) formed of passive components.

The biasing of circuit 8 is provided by resistive, capacitive, and inductive elements similar or identical to those described in relation with FIG. 3, with the difference that the biasing of the collectors of transistors 81, 82, 83, 84 and the bases of transistors 82 and 84 is performed from a potential which is positive with respect to ground. Thus, as an example, the emitters of transistors 81 and 83 are respectively coupled to ground by series associations of inductive elements 63', respectively 64', and resistive elements 65', respectively 66'. Still as an example, the common collector of transistors 81 and 82 and the base of transistor 82 are connected, by resistive elements, respectively 67' and 68', to an inductive element 69' of connection to a terminal 59' of application of a potential V+ positive with respect to ground. Further, the common collector of transistors 83 and 84 and the base of transistor 84 are connected, by resistive elements, respectively 70' and 71', to an inductive element 72' of connection to terminal 59'. Further, the base of transistor 82 is coupled, by a capacitive element 73', to the common collector of transistors 83 and 84, and the base of transistor 84 is coupled, by a capacitive element 74', to the common collector of transistors 81 and 82.

Here again, to show the function of biasing or of decoupling of elements 57' to 59' and 63' to 74', their respective connections have been illustrated in dotted lines.

Impedances 61 and 62 (FIG. 3) or 61' and 62' (FIG. 4) are preferably at least inductive and/or capacitive impedances and, preferably, resistive, inductive, and capacitive impedances. These impedances are series or parallel impedances in a PI or T assembly. Thus, they are not transistor-biasing elements. Each impedance ZL1, ZL2 appears in the form of a quadripole having its access terminals connected to the bases and to the emitters of transistors 82 and 84 (52 and 54 in the case of FIG. 3).

Figure 5:
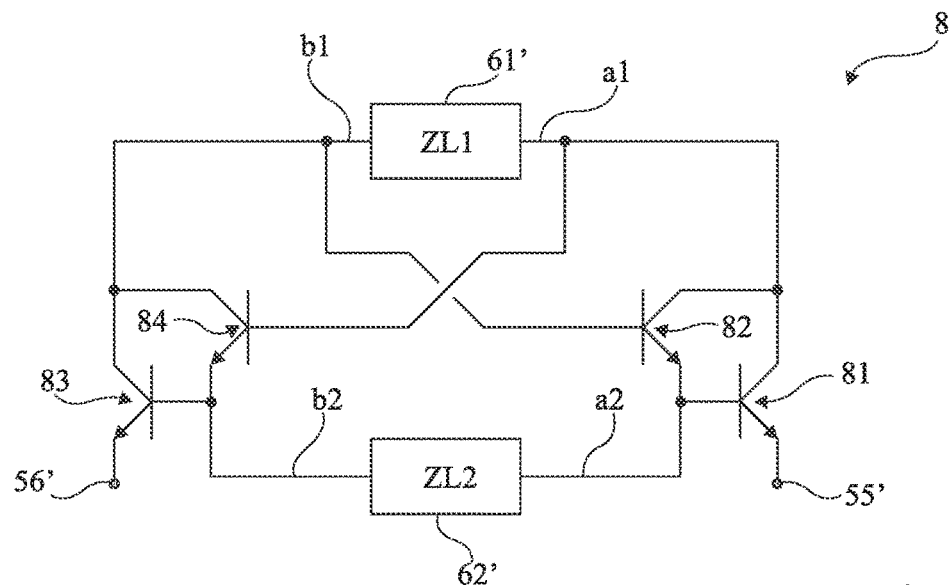
FIG. 5 shows the equivalent of the negative impedance circuit of FIG. 4 with no biasing or decoupling elements.

FIG. 5 shows the equivalent of negative impedance circuit 8 of FIG. 4 with no biasing or decoupling elements. This amounts to only considering the radio frequency behavior of the circuit. The radio frequencies more particularly targeted by the present description are greater than 10 MHz.

For the radio frequency behavior, elements 57 to 59' and 63' to 74' of FIG. 4 are not taken into account. The elements of transistors 81 and 83 are then connected to terminals 55' and 56'. The common collector of transistors 81 and 82 is connected to a first terminal a1 of impedance 61' and to the base of transistor 84. The common collector of transistors 83 and 84 is connected to a second terminal b1 of impedance 61' and to the base of transistor 82. The bases of transistors 81 and 83, respectively confounded with the emitters of transistors 82 and 84 are still coupled by impedance 62'. The diagram of FIG. 5 better shows the feedback loop formed between the pairs of transistors via impedance 61'.

Taking the example of FIG. 5 and assuming that all transistors are identical, of gain $\beta$ and of input resistance $h_{11}$, impedance transformation function Z of circuit 8 can be written as:

$$Z = -\frac{\beta^4}{1+\beta} \cdot ZL + \frac{h_{11}}{1+\beta}\left(1 + \frac{\beta^2 + 5\cdot\beta + 2}{\beta\cdot(1+\beta)}\right),$$

with:

$$ZL = ZL1 \frac{ZL1 - ZL2 - \frac{h_{11}}{\beta}}{ZL1 + ZL2\cdot(1-\beta^2) + h_{11}\cdot(1-\beta)}.$$

It can be seen that the impedance Z obtained between terminals 55' and 56' depends on a virtual load ZL having a slope of negative sign. However, load ZL essentially depends on the values of passive (positive) impedances ZL1 and ZL2. Thus, by varying the values of impedances ZL1 and ZL2 (of the resistive, capacitive, and inductive components forming them), the value of the obtained negative impedance can be varied. In the preferred embodiment where an impedance ZL2 is used, the range of possible values of the resulting negative impedance is increased. Preferably, at least some of the passive components forming impedances ZL1 and ZL2 are components of adjustable value to increase the adjustment possibilities in the application.

FIGS. 6A, 6B, 6C, 6D, and 6E illustrate examples of passive impedances capable of being selected to form impedances ZL1 and ZL2 of the circuits of FIGS. 3 to 5.

Figure 6A:
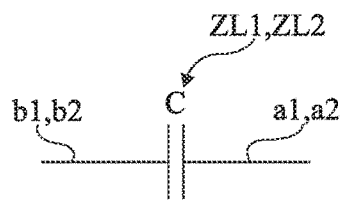
FIGS. 6A, 6B, 6C, 6D, and 6E illustrate examples of passive impedances forming elements of the circuits of FIGS. 3 to 5.

FIG. 6A illustrates the case of a passive impedance of a capacitive element C between terminals a1 and b1, respectively a2 and b2.

Figure 6B:
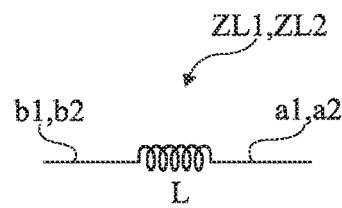

FIG. 6B illustrates the case of a passive impedance of an inductive element L between terminals a1 and b1, respectively a2 and b2.

Figure 6C:
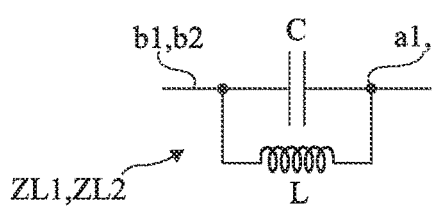

FIG. 6C illustrates the case of a passive impedance in the form of a parallel LC circuit, formed of a capacitive element C in parallel with an inductive element L, between terminals a1 and b1, respectively a2 and b2.

Figure 6D:
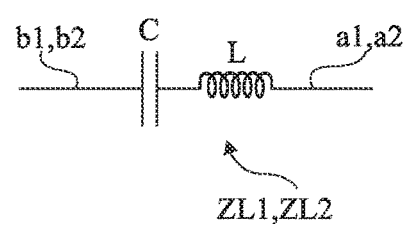

FIG. 6D illustrates the case of a passive impedance in the form of a series LC circuit, formed of a capacitive element C in series with an inductive element L, between terminals a1 and b1, respectively a2 and b2.

Figure 6E:
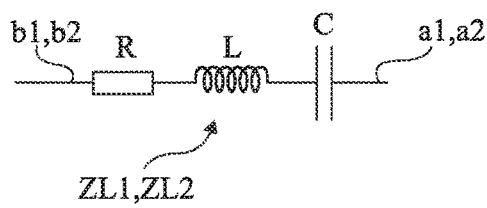

FIG. 6E illustrates the case of a passive impedance in the form of a series RLC circuit, formed of a resistive element R, a capacitive element C, and an inductive element L in series between terminals a1 and b1, respectively a2 and b2. The representation of FIG. 6E further forms the equivalent representation (series RLC circuit) of any embodiment of a passive impedance usable to form impedances ZL1 and ZL2.

The type of passive impedance may be different for impedance ZL1 and for impedance ZL2 in a same circuit, that is, for example, impedance ZL1 may be mainly capacitive and impedance ZL2 may be mainly inductive, or conversely.

An advantage of the described embodiments is that they enable to form negative impedances by using passive components having values compatible with radio frequency ranges. Each circuit 3 of FIG. 1 may for example be formed of a circuit 5 and 8.

It should be noted that, be it with an embodiment based on PNP transistor or NPN transistors, the collectors of the transistors of each pair are common and access terminals 55, 56 or 55', 56' of the obtained negative impedance dipole, are on the emitter side of the transistors.

Various embodiments have been described. Various alterations, modifications, and improvements will occur to those skilled in the art. In particular, the selection of the values of impedances ZL1 and ZL2 depends on the application and on the range of desired negative impedance values. Similarly, the values given to the biasing components depend on the application. Further, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A negative impedance circuit, comprising:
   a first and a second bipolar transistors having a common collector, a base of the first transistor being connected to an emitter of the second transistor;
   a third and a fourth bipolar transistors having a common collector, a base of the third transistor being connected to an emitter of the fourth transistor;
   at least one first impedance formed of one or of a plurality of passive components coupling the common collector of the first and second transistors to the common collector of the third and fourth transistors, a base of the second transistor being coupled to the collector of the third and fourth transistors and a base of the fourth transistor being coupled to the collector of the first and second transistors; and
   a second impedance at least inductive or capacitive, formed of one or a plurality of passive components, connecting the bases of the first and third transistors.

2. The circuit of claim 1, wherein said first impedance is at least inductive or capacitive.

3. The circuit of claim 1, wherein the emitters of the first and third transistors are respectively connected to terminals of the circuit.

4. The circuit of claim 3, wherein the connection between the respective emitters of the first and third transistors and said terminals is performed via capacitive decoupling elements.

5. The circuit of claim 1, wherein capacitive elements respectively connect the base of the second transistor to the common collector of the third and fourth transistors and the base of the fourth transistor to the common collector of the first and second transistors.

6. The circuit of claim 1, wherein resistive biasing elements individually connect the common collectors of the first and second transistors and the bases of the third and fourth transistors to a terminal of application of a bias voltage.

7. The circuit of claim 1, wherein the transistors are of PNP type.

8. The circuit of claim 1, wherein the transistors are of NPN type.

* * * * *